United States Patent
Koh

(10) Patent No.: US 6,893,988 B2
(45) Date of Patent: May 17, 2005

(54) METHOD FOR MANUFACTURING NON-VOLATILE MEMORY

(75) Inventor: Kwan Ju Koh, Bucheon-si (KR)

(73) Assignee: ANAM Semiconductor, Inc., Seoul (KR)

( * ) Notice: Subject to any disclaimer, the term of this patent is extended or adjusted under 35 U.S.C. 154(b) by 44 days.

(21) Appl. No.: 10/761,225

(22) Filed: Jan. 22, 2004

(65) Prior Publication Data

US 2004/0152286 A1 Aug. 5, 2004

(30) Foreign Application Priority Data

Feb. 4, 2003 (KR) .............................. 10-2003-0006823

(51) Int. Cl.[7] .......................................... H01L 21/336
(52) U.S. Cl. ..................................... 438/954; 438/258
(58) Field of Search ................................ 438/258, 954

(56) References Cited

U.S. PATENT DOCUMENTS 6,605,511 B2 * 8/2003 Pham et al. ................ 438/275

2003/0049905 A1 * 3/2003 Nitta et al. ................. 438/258

* cited by examiner

Primary Examiner—Asok Kumar Sarkar
(74) Attorney, Agent, or Firm—Finnegan, Henderson, Farabow, Garrett & Dunner, L.L.P.

(57) ABSTRACT

To manufacture a non-volatile memory, an oxide film is deposited on a substrate, a flash device area and a logic gate area are removed and a tunnel oxide layer is stacked on an opened surface of the substrate. A first polysilicon is stacked over the resultant structure, a polish is carried out and the oxide film is removed. An LDD is formed in an upper portion of the substrate excepting an area occupied by the tunnel oxide layer, a sidewall is deposited on a side of the first polysilicon, a drain and a source are generated beneath the LDD excepting an area contacted to the sidewall and a TEOS is stacked on the resultant structure excepting the flash device area. An ONO layer is deposited over the resultant structure, a second polysilicon is stacked over the ONO layer, a polish is carried out and the TEOS is removed.

4 Claims, 4 Drawing Sheets

10

METHOD FOR MANUFACTURING NON-VOLATILE MEMORY

FIELD OF THE INVENTION

The present invention relates to a method for manufacturing a non-volatile memory; and, more particularly, a method for manufacturing a non-volatile memory of a SONOS (Silicon-Oxide-Nitride-Oxide-Silicon) structure.

BACKGROUND OF THE INVENTION

Conventionally, semiconductor memories are classified into a volatile memory and a non-volatile memory. The volatile memory generally includes a RAM (Random Access Memory) such as a DRAM (Dynamic RAM) or a SRAM (Static RAM). Data may be written and stored in the volatile memory during applying a power supply but the data are volatilized therefrom if a power supply is shut off, thereby losing the data. On the contrary, the non-volatile memory, e.g., a ROM (Read Only Memory) stores data therein even though a power supply is not applied.

Non-volatile memories are divided into floating gate series and MIS (Metal Insulator Semiconductor) series depending on a processing technique. In the MIS, two or more kinds of dielectric films are multi-layered in double or triple layers.

The memory of the floating gate series stores data therein by using a potential well. Such memory of the floating gate series is represented by an ETOX (EEPROM (Electrically erasable programmable read only memory) Tunnel Oxide) structure widely employed as a flash EEPROM.

The memory of the MIS series stores data therein by using traps existing in a dielectric film bulk, an interface between two dielectric films and an interface between a dielectric film and a semiconductor. Such memory of the MIS series is represented by a MONOS/SONOS (Metal ONO Semiconductor/Silicon ONO Semiconductor) structure usually employed as a flash EEPROM.

With the development of the processing techniques, a SOC (System-on-Chip) technique is required and the importance thereof becomes a prominent figure. The SOC technique is referred to techniques capable of performing various functions on a single chip, i.e., basic Logic, SONOS and Flasys. However, such techniques involve too complicated processes.

SUMMARY OF THE INVENTION

There is, therefore, an object of the present invention to provide a method for manufacturing a non-volatile memory of a SONOS (Silicon-Oxide-Nitride-Oxide-Silicon) structure, which is capable of generating a logic cell and a flash cell in a substrate at a time, by using a damascene process.

In accordance with the present invention, there is provided a method for manufacturing a non-volatile memory of a SONOS (Silicon-Oxide-Nitride-Oxide-Silicon) structure, including the steps of: depositing an oxide film on a substrate; removing a flash device area and a logic gate area, wherein the flash device area and the logic gate area are areas of the oxide film on which a flash device and a logic gate is to be formed, respectively; stacking a tunnel oxide layer on an opened surface of the substrate corresponding to the area of the oxide film; stacking a first polysilicon over the resultant structure; carrying out a polish with respect to the first polysilicon down to a top surface of the oxide film; removing the oxide film; forming an LDD (lightly doped drain) in an upper portion of the substrate excepting an area occupied by the tunnel oxide layer; depositing a sidewall on a side of the first polysilicon; generating a drain and a source beneath the LDD excepting an area contacted to the sidewall; stacking a TEOS (Tetra Ethyl Ortho Silicate) on the resultant structure excepting the flash device area; depositing an ONO (Oxide-Nitride-Oxide) layer over the resultant structure; stacking a second polysilicon over the ONO layer; carrying out a polish with respect to the second polisilicon and the ONO layer down to a top surface of the TEOS; and removing the TEOS.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENT

Figure 1A:
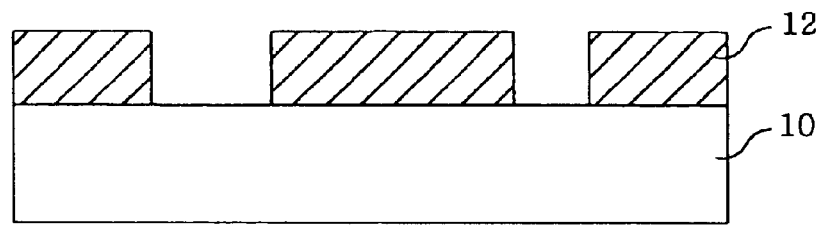
FIGS. 1A to 1J describe cross-sectional views of an object for showing a sequence of processes of manufacturing a non-volatile memory of a SONOS (Silicon-Oxide-Nitride-Oxide-Silicon) structure in accordance with the present invention.

FIGS. 1A to 1J represent a sequence of processes for manufacturing a non-volatile memory of a SONOS (Silicon-Oxide-Nitride-Oxide-Silicon) structure in accordance with a preferred embodiment of the present invention. In the drawings, a flash structure is constructed on a left portion and a logic area is built on a right portion.

Referring to FIG. 1A, an oxide film 12 is deposited on a silicon substrate 10 and an area of the oxide film 12 on which a flash device or a logic gate is to be formed is removed. A thickness of the oxide film 12, which may be adjusted to a gate size but varying depending on a type of a device, is, for example, about 2000 Å to 3000 Å.

Figure 1B:
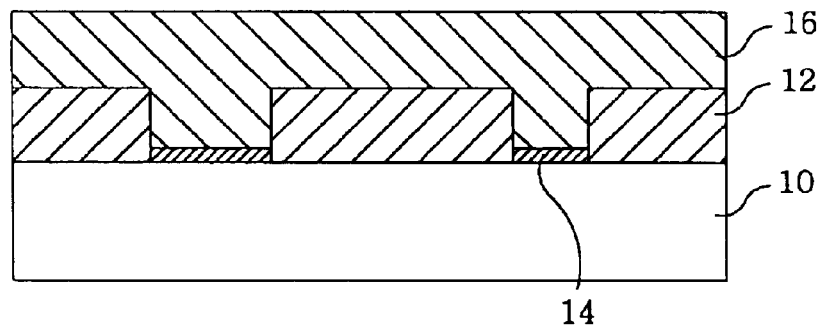

As shown in FIG. 1B, a tunnel oxide layer 14 is stacked on an opened surface of the silicon substrate 10 where the oxide film 12 is removed. Then a first polysilicon 16 is stacked over the resultant structure. In some cases, an implant is carried out in an area for the flash device, so that a threshold voltage Vt is preferably controlled.

Figure 1C:
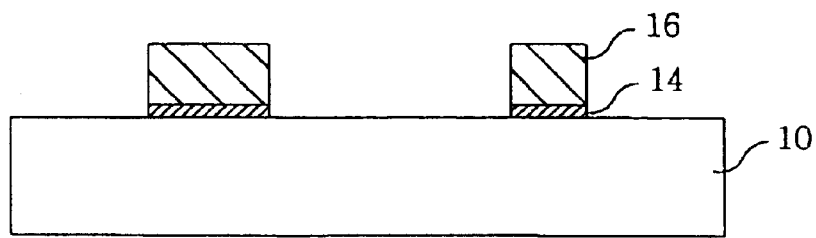

As illustrated in FIG. 1C, a CMP (chemical-mechanical polish) is carried out with respect to the first polysilicon 16 down to a top surface of oxide film 12. Thereafter, the oxide film 12 is etched away by a wet etching.

Figure 1D:
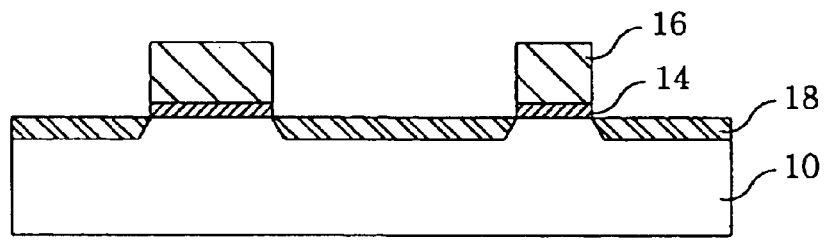

As presented in FIG. 1D, an LDD (lightly doped drain) 18 is formed in an upper portion of the silicon substrate 10 excepting an area occupied by the tunnel oxide layer 14.

Figure 1E:
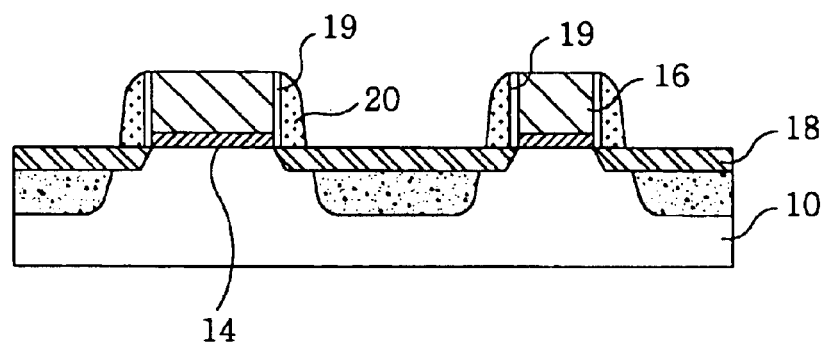

As provided in FIG. 1E, a sidewall 20 is deposited on a side of the first polysilicon 16. A source and a drain are generated beneath the LDD 18 excepting an area contacted to the sidewall 20. An oxide film 19 may be formed between the first polysilicon 16 and the sidewall 20 in order that the polysilicon 16 may be protected from being damaged during an implant process for forming a source and a drain.

Figure 1F:
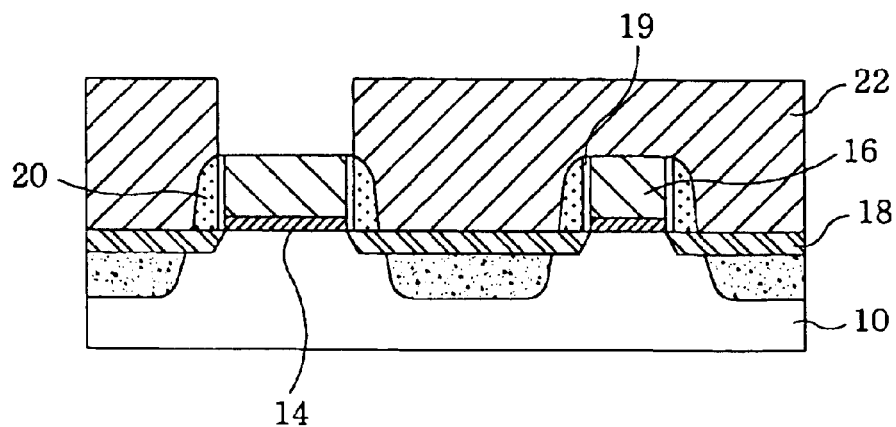

As depicted in FIG. 1F, a TEOS (Tetra Ethyl Ortho Silicate) 22 is stacked on the resultant structure excepting an area for the flash device.

Figure 1G:
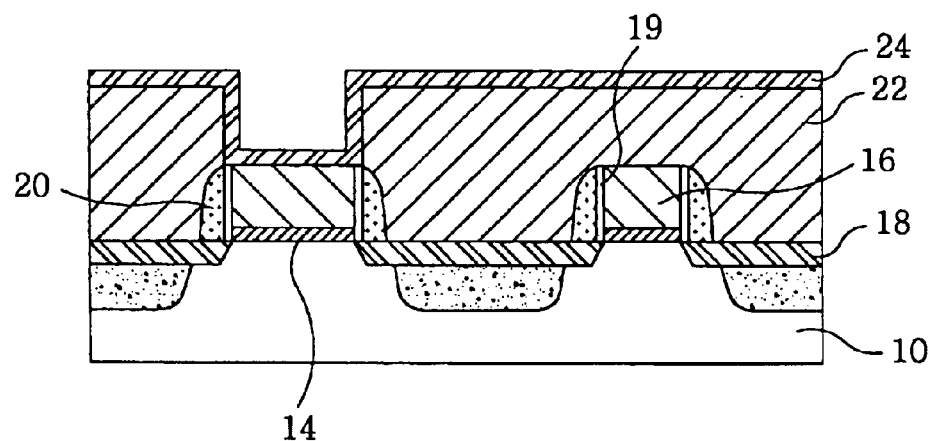

As represented in FIG. 1G, an ONO (Oxide-Nitride-Oxide) layer 24 is deposited over an entire outer surface of the resultant structure.

Figure 1H:
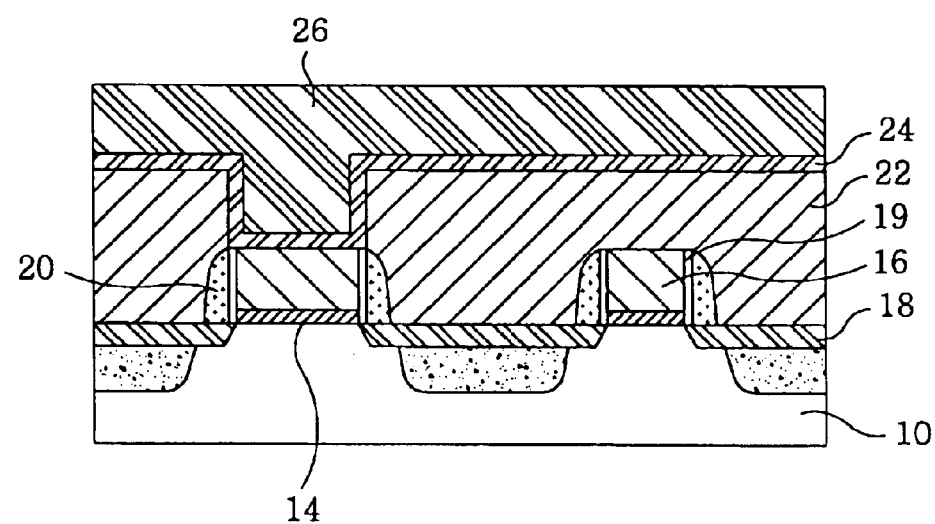

As explained in FIG. 1H, a second polysilicon 26 for forming a control gate is stacked over the ONO layer 24.

Figure 1I:
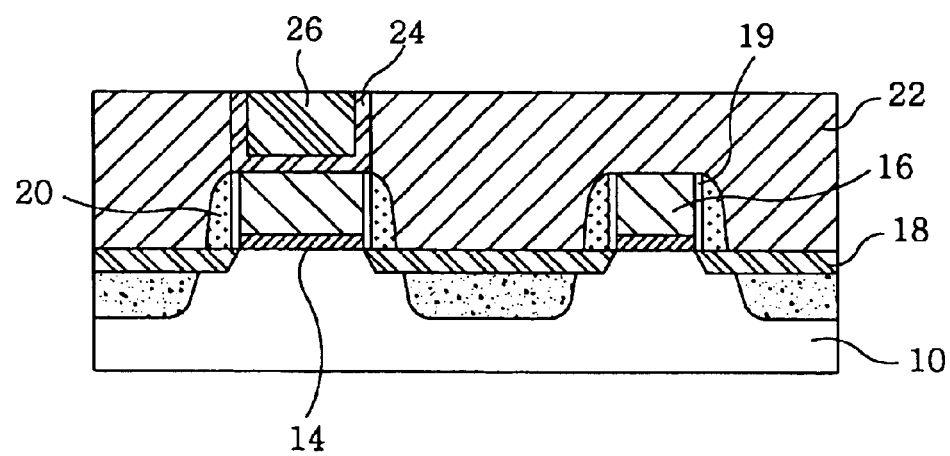

As described in FIG. 1I, a CMP is carried out with respect to the second polisilicon 26 and the ONO layer 24 down to a top surface of the TEOS 22.

Figure 1J:
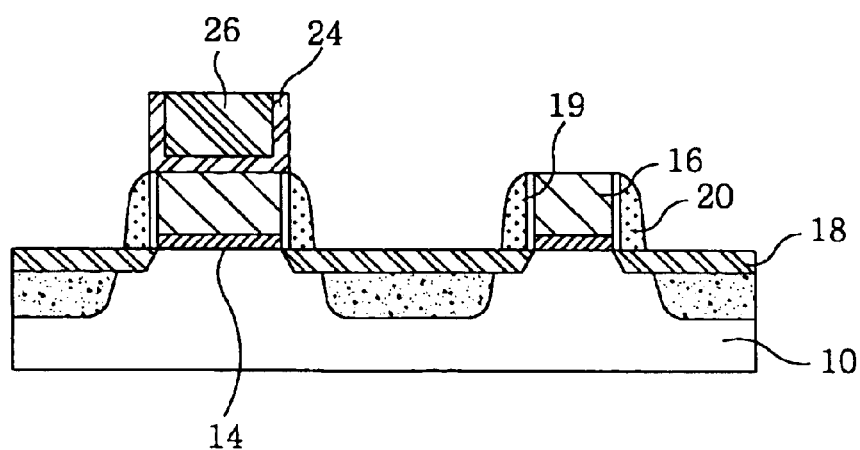

As seen in FIG. 1J, the TEOS 22 is etched away by a wet etching.

In accordance with the present invention, a damascene process is utilized in manufacturing a non-volatile memory of a SONOS structure; and a logic cell and a flash cell may be generated at a time. Accordingly, pattern processes can be simplified and stably controlled.

While the invention has been shown and described with respect to the preferred embodiments, it will be understood by those skilled in the art that various changes and modifications may be made without departing from the spirit and scope of the invention as defined in the following claims.

What is claimed is:

1. A method for manufacturing a non-volatile memory of a SONOS (Silicon-Oxide-Nitride-Oxide-Silicon) structure, comprising the steps of:

depositing an oxide film on a substrate;

removing the oxide film from a flash device area and a logic gate area, wherein the flash device area and the logic gate area are areas of the oxide film on which a flash device and a logic gate is to be formed, respectively;

stacking a tunnel oxide layer on an opened surface of the substrate corresponding to the area of the oxide film;

stacking a first polysilicon over the resultant structure;

carrying out a polish with respect to the first polysilicon down to a top surface of the oxide film;

removing the oxide film;

forming an LDD (lightly doped drain) in an upper portion of the substrate excepting an area occupied by the tunnel oxide layer;

depositing a sidewall on a side of the first polysilicon;

generating a drain and a source beneath the LDD excepting an area contacted to the sidewall;

stacking a TEOS (Tetra Ethyl Ortho Silicate) on the resultant structure excepting the flash device area;

depositing an ONO (Oxide-Nitride-Oxide) layer over the resultant structure;

stacking a second polysilicon over the ONO layer;

carrying out a polish with respect to the second polisilicon and the ONO layer down to a top surface of the TEOS; and removing the TEOS.

2. The method of claim 1, wherein the substrate is made of silicon.

3. The method of claim 1, wherein a thickness of the oxide film is about 2000 Å to 3000 Å.

4. The method of claim 1, wherein the polish is a chemical-mechanical polish.

* * * * *